(12) United States Patent
Averett et al.

(10) Patent No.: US 7,276,425 B2
(45) Date of Patent: Oct. 2, 2007

(54) SEMICONDUCTOR DEVICE AND METHOD OF PROVIDING REGIONS OF LOW SUBSTRATE CAPACITANCE

(75) Inventors: Guy E. Averett, Mesa, AZ (US); Keith G. Kamekona, Scottsdale, AZ (US); Sudhama C. Shastri, Phoenix, AZ (US); Weizhong Cai, Scottsdale, AZ (US); Gordon L. Bratten, Scottsdale, AZ (US); Bladimiro Ruiz, Jr., Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/285,968

(22) Filed: Nov. 25, 2005

(65) Prior Publication Data
US 2006/0081958 A1    Apr. 20, 2006

Related U.S. Application Data

(62) Division of application No. 10/072,145, filed on Feb. 7, 2002.

(51) Int. Cl.
*H01L 21/76* (2006.01)
(52) U.S. Cl. ..................... 438/421; 438/424
(58) Field of Classification Search ............... 438/221, 438/411, 421–427, 438, E21.076
See application file for complete search history.

(56) References Cited

U.S. PATENT DOCUMENTS 5,640,041 A *  6/1997  Lur et al. ................... 257/510
6,512,283 B2 *  1/2003  Davies ....................... 257/522

* cited by examiner

*Primary Examiner*—Theresa Doan
(74) *Attorney, Agent, or Firm*—Kevin B. Jackson

(57) ABSTRACT

A semiconductor device (2) includes a semiconductor substrate (12) having a surface (13) formed with a first recessed region (20). A first dielectric material (60) is deposited in the first recessed region and formed with a second recessed region (76), and a second dielectric material (100) is grown over the first dielectric material to seal the second recessed region.

15 Claims, 4 Drawing Sheets

US 7,276,425 B2

SEMICONDUCTOR DEVICE AND METHOD OF PROVIDING REGIONS OF LOW SUBSTRATE CAPACITANCE

Divisional of prior U.S. application Ser. No. 10/072,145, filed on Feb. 7, 2002, having U.S. Examiner Ori Nadav in Group Art Unit 2811.

BACKGROUND OF THE INVENTION

The present invention relates in general to semiconductor devices and, more particularly, to integrated circuits having components formed on a low capacitance region of a semiconductor die.

Semiconductor technology continues to scale transistors to have smaller dimensions in order to provide increased functionality and a higher frequency capability. For example, wireless communication devices often use integrated circuits that include high-density digital signal processing functions on the same die as analog circuits operating at frequencies in excess of five gigahertz.

However, some integrated circuit components, such as passive devices, are not readily scalable. These devices have relatively high parasitic substrate capacitances, which often limits the overall frequency capability of an integrated circuit. For example, inductors are not easily reduced in size without reducing their quality factor or inductance to an unacceptable level, and bonding pads are not scalable because of the need to attach wire bonds to the bonding pads.

A variety of techniques have been tried to reduce the parasitic capacitances of passive integrated circuit components. One such technique is to form the components over a low permittivity material. However, current low permittivity materials are limited to film thicknesses that are too thin to produce a substantial reduction in parasitic capacitance. Another approach is to form the components over a thick dielectric film in which are formed air gaps or voids that reduce the overall permittivity of the dielectric film. Previously, voids were formed using thermally grown dielectric films to form the trench, and deposited films to seal them. However, voids made with such films introduce substantial stress in a semiconductor substrate, which degrades the performance and reliability of the integrated circuit. Also, these voids are not optimized for reducing capacitance due to the relatively high dielectric constant of the films used to form them. Furthermore, the voids are filled with these films during the sealing process producing a void with increased dielectric constant. Other schemes reduce the stress by producing fewer voids or voids with only a limited volume, which has a correspondingly limited effect on parasitic capacitance. Moreover, in order to avoid contaminating the transistors or reducing the die yield or reliability, complex and costly schemes are required to enable the integration of the low permittivity structures with active devices such as transistors.

Hence, there is a need for a low capacitance structure and method of making an integrated circuit that maintains a low cost while reducing die stress and avoiding the introduction of contaminants into the integrated circuit.

DETAILED DESCRIPTION OF THE DRAWINGS

In the figures, elements having the same reference number have similar functionality.

Figure 1:
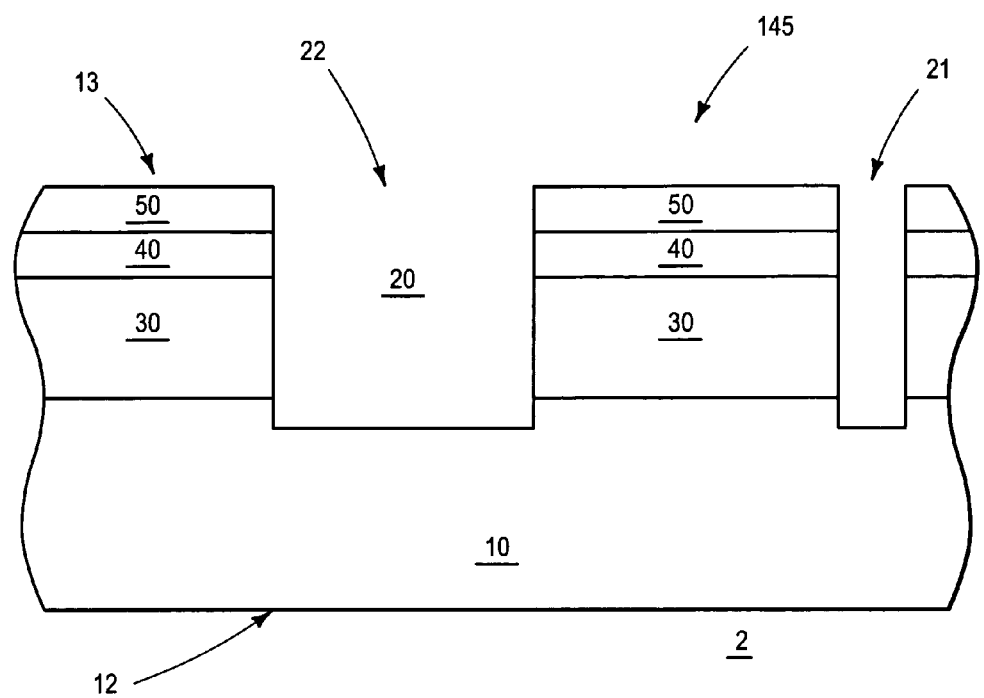
FIG. 1 is a cross-sectional view of an integrated circuit after a first fabrication stage.

FIG. 1 is a cross-sectional view of an integrated circuit or semiconductor device 2 formed with a semiconductor substrate 12 after a first processing stage.

Semiconductor substrate 12 includes a base layer 10 formed to have a thickness of about two hundred and fifty micrometers. In one embodiment, base layer 10 is heavily doped to have a p-type conductivity and a resistivity of about 0.01 ohm-centimeters to function as a ground plane for integrated circuit 2. In one embodiment, base layer 10 comprises monocrystalline silicon.

An epitaxial layer 30 is grown to a thickness of about three micrometers over base layer 10. In one embodiment, epitaxial layer 30 comprises monocrystalline silicon doped to have a p-type conductivity and a resistivity of about twenty ohm-centimeters.

A dielectric layer 40 is formed over epitaxial layer 30 to a thickness of about three hundred Angstroms to form a hard mask. In one embodiment, dielectric layer 40 is formed with a thermally grown silicon dioxide.

A dielectric layer 50 is formed over dielectric layer 40. In one embodiment dielectric layer 50 is formed with plasma enhanced chemical vapor deposition (PECVD) tetra-ethyl-ortho-silicate (TEOS) glass as a blanket silicon dioxide to a thickness of about three thousand Angstroms.

A surface 13 of substrate 12 is patterned with photoresist to mask a series of standard etch steps that remove exposed portions of dielectric layer 40 and dielectric layer 50. A standard anisotropic silicon etch is then applied to remove exposed portions of epitaxial layer 30 and base layer 10 to concurrently form recessed region or trench 20 within an isolation region 22, and recessed region or trench 21 around an active device region 145. Isolation region 22 is for forming electrical components such as passive devices and bonding pads, and active region 145 for forming transistors and other active devices.

Recessed regions 20 and 21 typically are formed concurrently and with the same processing steps. However, in order to accommodate potentially different isolation requirements of active device regions as compared to passive component isolation regions, recessed region 20 within isolation region 22 and recessed region 21 around active device isolation area 145 may have different vertical and lateral dimensions, although processed using the same fabrication steps. In one embodiment, recessed region 20 in is formed to a depth of about five micrometers and a width of about three micrometers. In one embodiment, recessed region 21 is formed to a depth of about five micrometers and a width of about two micrometers.

Figure 2:
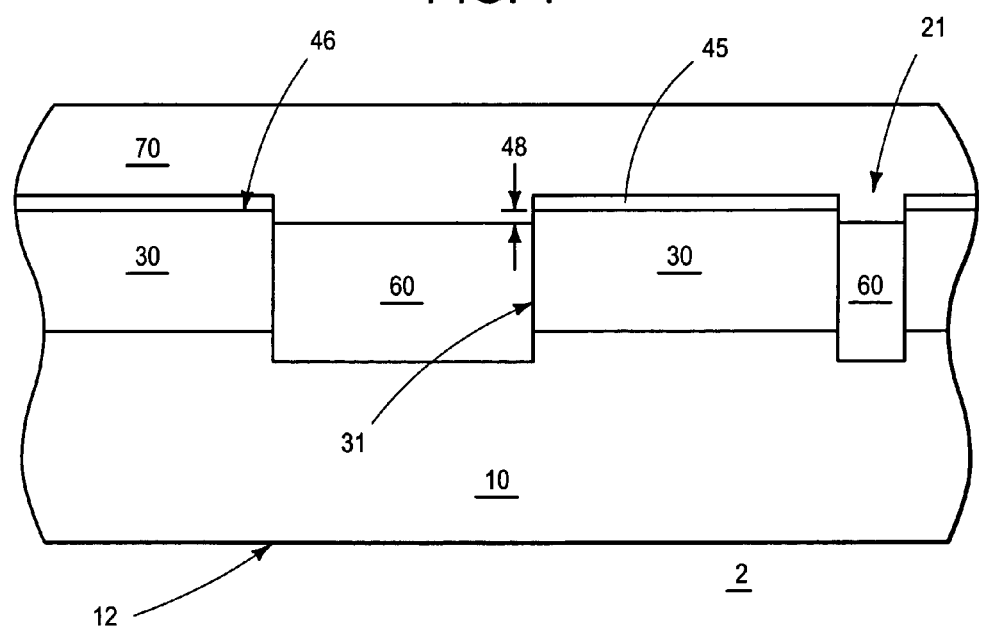
FIG. 2 is a cross-sectional view of the integrated circuit after a second fabrication stage.

FIG. 2 shows a cross-sectional view of integrated circuit 2 after a second fabrication stage. A standard wet chemistry etch is used to clean the recessed region 20, and during this clean TEOS dielectric layer 50 is removed and some of the dielectric layer 40 is removed leaving a portion 45 of dielectric layer 40 as shown.

In one embodiment, a dielectric layer (not shown) is formed in recessed region 20 over sidewalls 31 of epitaxial layer 30 to a thickness of about three hundred Angstroms to promote adhesion of subsequent layers to the epitaxial layer.

A dielectric material 60 is then deposited onto substrate 12 covering the substrate and filling recessed region 20. In one embodiment, dielectric material 60 is silicon dioxide formed with PECVD TEOS deposited at a temperature of about three hundred and fifty degrees centigrade for about thirty minutes. Dielectric material 60 typically has a dielectric constant of about 3.5 and is formed to a thickness of about 4.5 micrometers, filling recessed region 20 above dielectric layer 45.

Deposited dielectrics such as dielectric material 60 have several advantages over thermally grown films or silicon. For example, thick dielectric films are formed quickly and at low temperatures, have reduced stress, a minimal impact on the overall thermal budget, low cost, and fast etching characteristics. In addition, the dielectric constants typically are lower than many other films or materials used to form low dielectric structures.

Dielectric material 60 is then subjected to a blanket, timed etch to remove a predetermined thickness, leaving dielectric material within recessed region 20 to a level below dielectric layer 45. In one embodiment, the dielectric material etch back process is performed using reactive ion-etch to a distance 48 below surface 46 to define the thickness of materials deposited in recessed region 20 as described in detail below. In one embodiment, the dielectric material 60 is etched back so that distance 48 is approximately 0.5 micrometers below surface 46.

A material 70 is deposited onto the substrate 12, covering the surface of substrate 12 and filling trench 20 above dielectric layer 45. In one embodiment, the material 70 is formed with chemical vapor deposition (CVD) polysilicon at a temperature of about six-hundred and twenty five degrees centigrade and a thickness of about four-thousand five-hundred Angstroms for about forty-five minutes.

Figure 3:
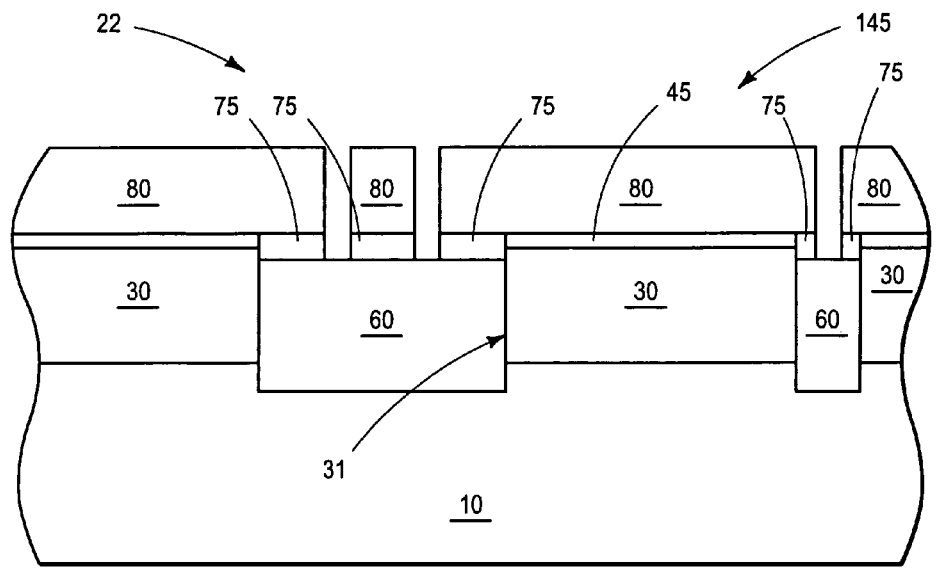
FIG. 3 is a cross-sectional view of the integrated circuit after a third fabrication stage.

FIG. 3 shows a cross-sectional view of integrated circuit 2 after a third fabrication stage. A standard planarizing etch is performed using dielectric layer 45 as an etch stop. A photo mask layer 80 is applied over the material and used to pattern an etch that removes exposed portions of layer 70 and stops on dielectric material 60 to form a cap layer 75.

In one embodiment, a compression layer (not shown) comprising CVD silicon nitride at a temperature of about seven hundred eighty degrees centigrade for about eighty minutes to a thickness of about two thousand Angstroms is deposited on top of cap layer 75. When oxidized, this compression layer provides additional lateral expansion of cap layer 75 as a means to seal larger recessed regions during later processing, although for smaller recessed regions this compression layer may not be required.

Figure 4:
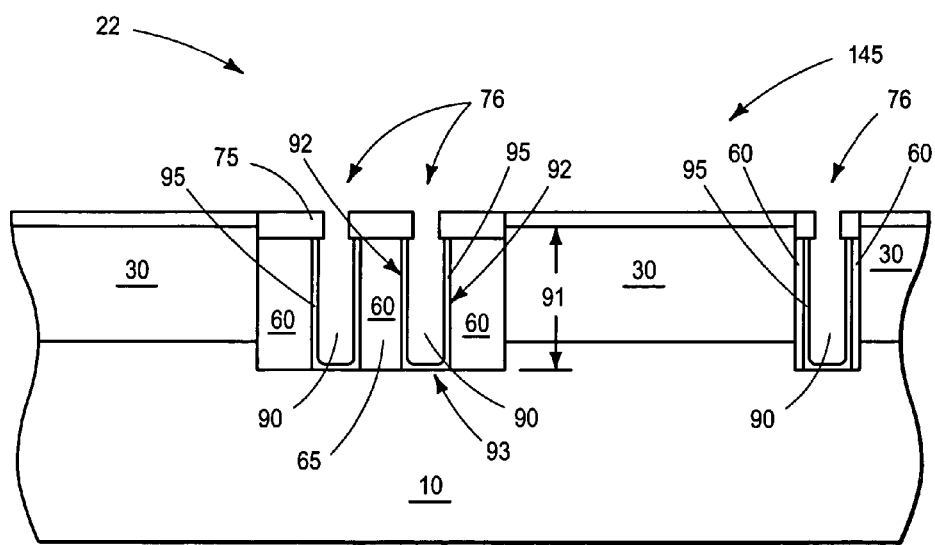
FIG. 4 is a cross-sectional view of the integrated circuit after a fourth fabrication stage.

FIG. 4 shows a cross-sectional view of integrated circuit 2 after a fourth fabrication stage. Photo mask layer 80 is removed. An etch is performed to remove the dielectric material 60 to a depth 91 of about four and one-half micrometers to form a recessed region or trench 76 that define an array of pillars 65. In one embodiment, the etch is formed using reactive ion etching at a temperature of about three-hundred and fifty degrees centigrade, a pressure of about 250 millitorr, a power of about 1500 watts using the gases sulfur hexafluoride and oxygen until the material is cleared from the bottom 93 of the trench 76.

A dielectric material 95 is deposited onto walls 92 to provide reinforcement for additional stability under stress and to reduce defects. In one embodiment, dielectric material 95 is formed having a dielectric constant of about 11.8 using CVD polysilicon deposited at a temperature of about six-hundred and fifty degrees centigrade for about five minutes to a thickness of about five-hundred Angstroms. In another embodiment, dielectric material 95 is formed with amorphous silicon having a dielectric constant of about 11.8 to a thickness of about five-hundred Angstroms using chemical vapor deposition performed at a temperature of about five-hundred fifty degrees centigrade for about twenty-five minutes.

In an embodiment where recessed region 20 has a small area so stability and defects are less critical, the pillar reinforcement process described above can be left out to reduce costs.

Figure 5:
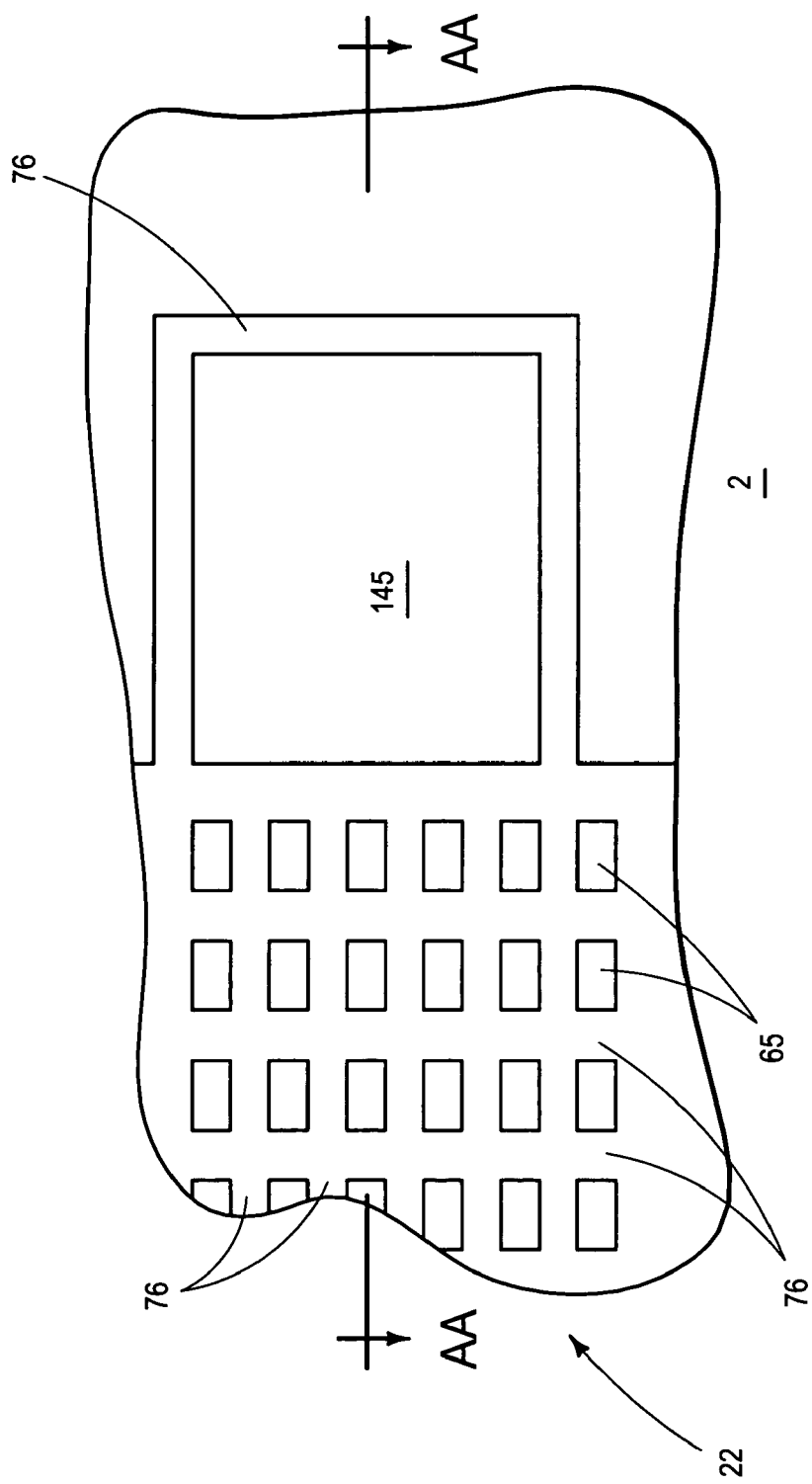
FIG. 5 is a top view of the integrated circuit after the fourth fabrication stage.

FIG. 5 is a top view of integrated circuit 2 showing features of isolation region 22 and active region 145 after the processing stage described in FIG. 4. Trench 76 surrounds and effectively defines active region 145 as shown, and within isolation region 22 form a matrix or grid to define pillars 65. As will be apparent from the subsequent processing steps, a variety of alternate arrangements can be used to form the trench 76. For example, an array of holes could be etched to form trench 76, effectively reversing the positions of pillars 65 and trench 76. That is, pillars 65 can be formed as a contiguous matrix while trench 76 are etched as an array of discrete holes. Alternatively, trench 76 may be formed as a series of parallel trenches or recessed regions within isolation region 22. Furthermore, while pillars 65 are shown having a generally rectangular shape, pillars 65 can be of other shapes including generally oval, generally reticulated, and generally elongated.

Figure 6:
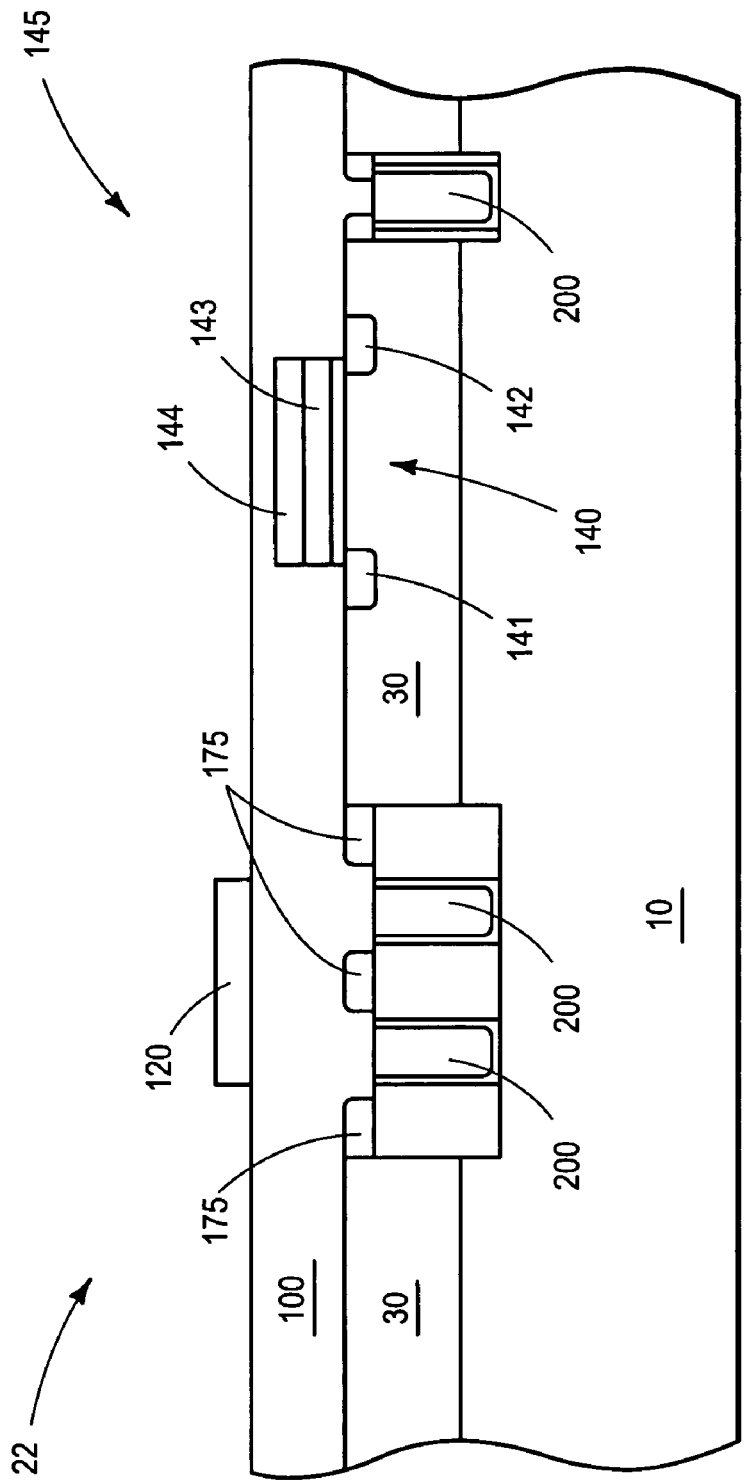
FIG. 6 is a cross-sectional view of the integrated circuit after a fifth fabrication stage.

FIG. 6 shows a cross-sectional view of integrated circuit 2 after a fifth fabrication stage. Recall that cap layer 75 is formed with polysilicon, which now is thermally oxidized at a temperature of about one thousand degrees centigrade to form a dielectric material 100 that seals openings of trench 76 to form voids 200. In one embodiment, dielectric material 100 is formed with a dielectric constant of about 3.8 to a thickness of approximately 0.2 micrometers above EPI layer 30. Depending on the dimensions of the trench 76, some of the silicon material 175 of cap layer 75 may not be converted to silicon dioxide. For example, if the dimensions are suitable and a shorter oxidation step is desired, complete oxidation of cap layer 75 is not needed to seal recessed region 76. Note that by thermally oxidizing cap layer 75 to produce the dielectric material 100 sealing the openings of the trench 76, the invention avoids the problem of prior art in which void sealing material is also substantially deposited into the trench resulting in voids with less gaseous volume, thus higher dielectric constant.

Dielectric material 100 is patterned and/or removed in the active region and an active device 140 such as an n-channel metal-oxide-semiconductor field-effect transistor is formed as follows. A dielectric material is thermally grown over epitaxial layer 30 and a polysilicon material is deposited over the dielectric material. The polysilicon and dielectric materials are patterned and etched to form a gate dielectric 143 and an overlying gate electrode 144 of transistor 140 as shown. Gate dielectric 143 and gate electrode 144 are used in combination with a photoresist layer (not shown) to form a mask for introducing n-type dopants into epitaxial layer 30 to form a self-aligned source 141 and drain 142 of transistor 140. In one embodiment, source 141 and drain 142 are heavily doped and formed to a depth of about one-half micrometer.

The region between the pillars 90 that have been sealed off to produce voids 200 are so designated because they are filled with a gaseous material, which in one embodiment may be air. Voids 200 may also be filled with argon or another ambient gas that is present when the trench 76 become sealed off.

Note that voids 200 are formed early in the process, i.e., before transistor 140 is formed. For some processes required to form transistor 140 it may be advantageous to leave the step of sealing as described above until the gate dielectric 143 formation such that any concerns of gases trapped in the voids are eliminated, or to accommodate the transistor thermal processing budget. The simple process described above is compatible with standard semiconductor processing, has a low thermal budget, and can be implemented at virtually any point of an active device fabrication process.

Dielectric material is deposited on substrate 12 and planarized to re-form the layer 100 as shown in FIG. 6. Dielectric material 100 may also function as an interlayer dielectric that separates metallization interconnect layers.

The effective dielectric constant of isolation region 22 is a combination of the dielectric constant or permittivity of voids 200 and the permittivity of the material used to form the pillars 65, and dielectric material 100. In one embodiment, the gaseous material contained in voids 200 has a dielectric constant substantially equal to one, and the wall reinforcement material 95 has a dielectric constant of about 3.8, thus the overall dielectric constant of the isolation region formed is less than 3.8, depending on the relative volumes of pillars 65, reinforcement material 95, and voids 200. Thus, the invention avoids the problem of prior art in which the isolation region 22 is comprised of gas, dielectric material, and semiconductor material thus producing a isolation region having a correspondingly higher dielectric constant. Hence, isolation region 22 has a low effective permittivity for forming electrical components with a low parasitic substrate capacitance.

An electrical component 120 is formed on dielectric material 100 over isolation region 22. Electrical component 120 has a low parasitic capacitance to substrate 12, and therefore a higher frequency capability, because of the low permittivity of isolation region 22. Electrical component 120 may be a bonding pad, a passive component such as an inductor, capacitor or resistor, or another electrical device suitable for formation over a dielectric material.

In summary, the present invention provides a semiconductor device comprising a semiconductor substrate having a surface formed with a first recessed region; a first dielectric material deposited in the first recessed region and formed with a second recessed region; and a second dielectric material grown over the first dielectric material to seal the second recessed region.

What is claimed is:

1. A method of fabricating an integrated circuit, comprising the steps of:
providing a semiconductor substrate having a recessed region;
forming a first dielectric material within the recessed region;
forming a capping layer comprising a semiconductor material overlying the first dielectric material;
forming openings in the capping layer to expose portions of the first dielectric material;
etching the first dielectric material through the openings to form dielectric pillars while leaving portions of the capping layer overlying top surfaces of the dielectric pillars;
growing a second dielectric material to form a seal over the dielectric pillars and voids between the dielectric pillars, wherein the portions of the capping layer are configured to enhance growth of the second dielectc material to form the seal thereby maximizing volume of the voids; and
forming a passive component over the second dielectric material.

2. The method of claim 1, wherein the step of forming the capping layer comprises forming a polysilicon layer.

3. The method of claim 1, wherein the step of growing the second dielectric material includes the step of thermally oxidizing the capping layer.

4. The method of claim 1, wherein the step of forming passive component includes forming a bonding pad.

5. A method of forming a semiconductor device having a region of low substrate capacitance comprising the steps of:
forming a first recessed region in a portion of a semiconductor substrate;
forming a first dielectric layer within the first recessed region;
forming a layer of semiconductor material overlying the first dielectric layer;
forming a plurality of openings in the layer of semiconductor material to expose portions of the first dielectric layer;
removing portions of the first dielectric layer through the plurality of openings to form a plurality of dielectric pillars while leaving portions of the layer of semiconductor material to form a plurality of cap layers overlying top surfaces of the plurality of dielectric pillars; and
thermally oxidizing the plurality of cap layers to form a second dielectric layer that seals voids between adjacent dielectric pillars, wherein the plurality of cap layers is configured to increase volume of each sealed void by minimizing formation of the second dielectric layer on sidewalls of the plurality of dielectric pillars.

6. The method of claim 5, wherein the step of forming the layer of semiconductor material including forming a polysilicon layer.

7. The method of claim 6, wherein the step of forming the polysilicon layer includes forming a polysilicon layer having a thickness of about two thousand five hundred angstroms.

8. The method of claim 5, wherein the step of forming the first dielectric layer within the first recessed region includes forming the first dielectric layer so that an upper surface of the first dielectric layer is recessed below a major surface of the semiconductor substrate.

9. The method of claim 8, further comprising the step of planarizing the layer of semiconductor material.

10. The method of claim 5, wherein the step of forming the first dielectric layer includes forming the first dielectric layer having a dielectric constant of about 3.

11. The method of claim 10, wherein the step of forming the first dielectric layer includes forming the first dielectric layer using chemical vapor deposition.

12. The method of claim 5, wherein the step of forming the first dielectric layer includes forming a deposited oxide layer using a tetra-ethyl-ortho-silicate source.

13. The method of claim 5, wherein the step of thermally oxidizing the plurality of cap layers consumes only a portion of each cap layer.

14. The method of claim 5, further comprising the step of forming a layer of material on sidewalls of the plurality of dielectric pillars, wherein the layer of material is configured to reinforce the plurality of dielectric pillars.

15. The method of claim 14, wherein the step of forming the layer of material includes forming a layer of amorphous silicon having a thickness of about five hundred angstroms.

* * * * *